(12) United States Patent
Voorde et al.

(10) Patent No.: US 6,709,943 B2
(45) Date of Patent: Mar. 23, 2004

(54) METHOD OF FORMING SEMICONDUCTOR DIFFUSED RESISTORS WITH OPTIMIZED TEMPERATURE DEPENDENCE

(75) Inventors: Paul Vande Voorde, San Mateo, CA (US); Chun-Mai Liu, San Jose, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/228,231

(22) Filed: Aug. 26, 2002

(65) Prior Publication Data

US 2004/0036144 A1 Feb. 26, 2004

(51) Int. Cl.[7] .............................................. H01L 27/02
(52) U.S. Cl. ...................................... 438/382; 438/385
(58) Field of Search ........................ 438/238, 381–385

(56) References Cited

U.S. PATENT DOCUMENTS

| 3,491,325 A | 1/1970 | Hu |
| 3,548,269 A | 12/1970 | MacDougall et al. |
| 3,683,306 A | 8/1972 | Bulthuis et al. |
| 3,829,890 A | 8/1974 | Perloff et al. |
| 6,255,185 B1 * | 7/2001 | Coolbaugh et al. ......... 438/382 |

* cited by examiner

*Primary Examiner*—Jey Tsai
(74) *Attorney, Agent, or Firm*—Blakely, Sokoloff, Taylor & Zafman LLP

(57) ABSTRACT

Ion implanted resistors formed in the body of a crystalline silicon substrate. The resistors have a different conductivity type from that of the silicon substrate. The sheet resistance and temperature dependence of the resistor layer is determined by the dose of the implant. Temperature variation can be optimized to be less than 2% over the temperature range −40 C to +85 C. Furthermore, the temperature variation at room temperature (~25 C) can be reduced to nearly zero.

13 Claims, 2 Drawing Sheets

METHOD OF FORMING SEMICONDUCTOR DIFFUSED RESISTORS WITH OPTIMIZED TEMPERATURE DEPENDENCE

BACKGROUND OF THE INVENTION

1. Field of the Invention

The present invention relates to the field of silicon integrated circuits and integrated circuit fabrication, and more particularly, to the formation of resistive circuit elements within the silicon substrate having optimized temperature dependence.

2. Prior Art

Over the last twenty years, there have been numerous patents related to resistor elements for integrated circuits. Most of this work pertains to resistors formed in poly silicon. A subset of this work relates to the reduction of temperature dependence of these resistor elements. Since the issues of temperature variability in poly silicon resistors is different than for resistors implanted and/or diffused in crystalline silicon, these prior art patents are not relevant to the present invention.

For implanted or diffused resistors, most of the prior art patents date back to the 1970's and even earlier. These older patents discuss techniques for reducing the temperature dependence of implanted resistors. These techniques include varying anneal temperatures, different dopant compensation schemes, neutral species implants, and others. Most of the preferred implementations use p-type resistors in n-type substrates, since PMOS was the dominant integrated circuit technology in the early 1970's. Patents have not been found that address the reduction of temperature dependence by simply adjusting the n-type (phosphorus or arsenic) implant dose. Patents of background interest include U.S. Pat. No. 3,829,890 issued Aug. 13, 1974, "Ion Implanted Resistor and Method," U.S. Pat. No. 3,683,306 issued Aug. 8, 1972, "Temperature Compensated Semiconductor Resistor Containing Neutral Inactive Impurities," U.S. Pat. No. 3,548,269 issued Dec. 15, 1970, "Resistive Layer Semiconductor Device" and U.S. Pat. No. 3,491,325 issued Jan. 20, 1970, "Temperature Compensation for Semiconductor Devices."

In modern technologies, both CMOS and Bipolar, precision resistors are usually formed in poly silicon or, occasionally, by use of specialized metal films. These types of resistors are well isolated from the silicon substrate, resulting in low capacitance and good immunity from substrate bias.

Implanted bulk resistors are still used because of the relative process simplicity and typically superior matching characteristics. Often, implants that are already in the process are used to make a "free" resistor. In the case where specialized resistor implants are added to the process, the implant dose is chosen to provide a reasonable sheet resistance, temperature dependence and process control within the existing process. It has not been recognized that the temperature dependence can be optimized while still maintaining sheet resistance values that are still within a desirable range.

BRIEF SUMMARY OF THE INVENTION

N-type implanted resistors are formed within a conventional CMOS process with highly desirable sheet resistance (a few hundred ohms per square) and optimized temperature dependence: as little as 2% total variation across the industrial temperature range of −40 C to +85 C. This is achieved by only varying the dose of the resistor implant, with no specialized thermal cycles being used to activate the implanted resistor. Instead, the highly desirable sheet resistance and excellent temperature dependence are obtained using the existing thermal steps within a conventional CMOS process. Superior results are achieved using arsenic implantation as opposed to phosphorus implantation.

DETAILED DESCRIPTION OF THE PREFERRED EMBODIMENTS

Figure 1:
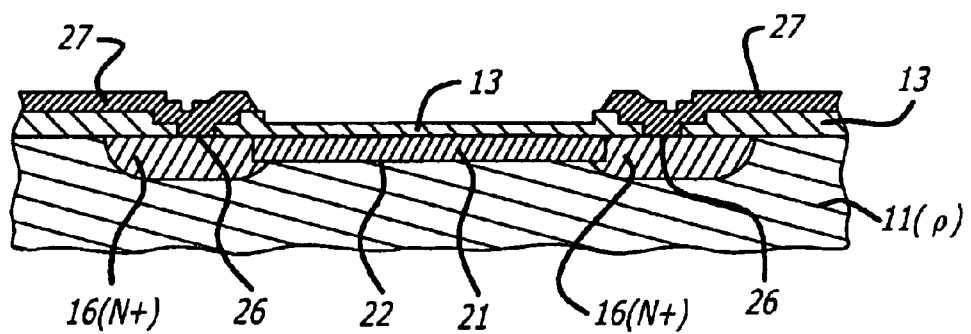
FIG. 1 illustrates the basic structure of an implanted resistor as use in itegrated circuits and which may incorporate the present invention.

FIG. 1 illustrates the basic structure of an implanted resistor as used in integrated circuits. Conventional process steps of masking, implantation, annealing, deposition and etch are used to form this structure. The process begins with a silicon substrate 11, which is typically p-type in CMOS processes. Regions of heavily doped n-type 16 are formed as the end caps of the resistor to provide low resistance ohmic contact to the resistor region 21. A special resistor implant is then used to form the resistor region 21. The resistor region and end caps are separated from the substrate 11 by an NP junction 22 that will be back-biased in use. A conventional dielectric layer 13 is deposited over the resistor and contact holes 26 are etched to provide access for contact to the resistor end caps. One of many well-known contact metallization 27 schemes and pattern etching can then be used to provide a patterned metal layer to make electrical contact to the resistor.

Figure 2:
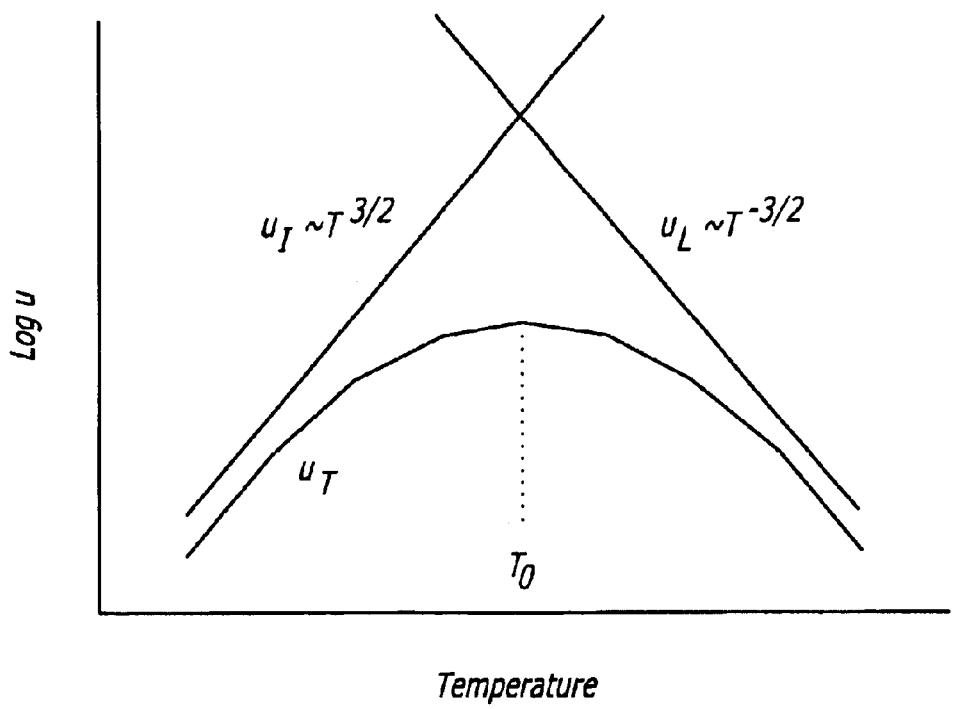
FIG. 2 shows e temperature dependence of the electrical mob charge carriers (electrons or holes) in crystalline silicon.

FIG. 2 shows the temperature dependence of the electrical mobility of charge carriers (electrons or holes) in crystalline silicon. There are two dominant scattering mechanisms in silicon:ionized impurity scattering and phonon scattering, also known as lattice scattering. For impurity scattering the mobility (u) increases with absolute temperature (T): $U_I \sim T^{3/2}$, while for lattice scattering the mobility decreases with absolute temperature: $U_L \sim T^{-3/2}$. The combined mobility is given as $UT=(1/U_I+1/U_L)^{-1}$. Note that the competition between the two scattering mechanisms produces a maximum in the mobility versus temperature curve at temperature $T_0$. Since the conductivity of the resistor layer 21 is proportional to the mobility times the number of charge carriers, this leads to a maximum in the conductivity, or a minimum in the sheet resistance, versus temperature curve. The slope of the sheet resistance versus temperature curve is the Temperature Coefficient of Resistance (TCR).

The goal is to adjust the resistor doping profile so that the minimum of resistance falls near the middle of the temperature range of interest, thereby minimizing the total variation across that range. For the common industrial temperature range of −40 C to +85 C, the minimum should be near room temperature (~25 C).

The lattice scattering mobility is only a function of temperature and thus cannot be changed. The impurity scattering mobility depends on both temperature and the density of ionized impurities. For lightly doped layers, $N_D$ <5e17 cm$^{-3}$, the ionized impurity density is low, and the mobility is dominated by the lattice scattering at room temperature, and resistance increases with temperature (positive TCR) around room temperature. At higher concentrations, impurity scattering becomes important at room temperature, and $T_0$ can be increased up to room temperature. At still higher concentrations, other heavy doping effects come into play and the TCR again becomes more increasingly positive.

Figure 3:
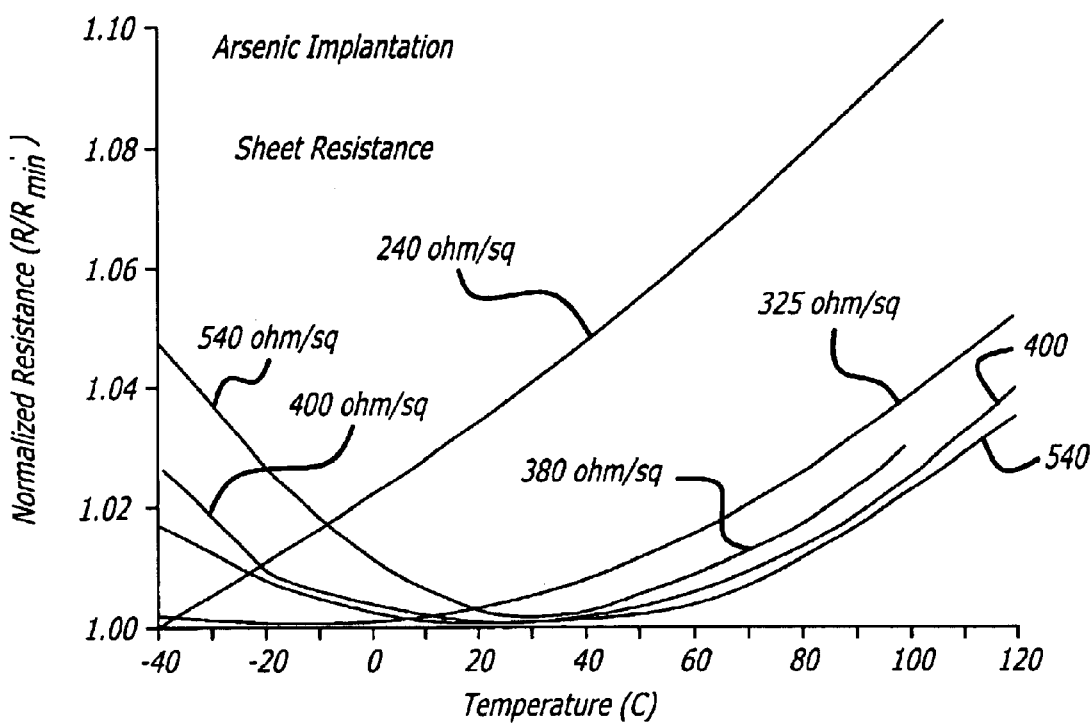
FIG. 3 is a of the normalized resistance ($R/R_{min}$) versus tempera e for sheet resistances of 240, 325, 380, 400 and 540 ohms per square using Arsenic implantation in p-type silicon.

The foregoing is illustrated by the measurements on Arsenic implanted resistors shown in FIG. 3. This Figure provides a graph of the normalized resistance (R/R$_{min}$) versus temperature for sheet resistances of 240, 325, 380, 400 and 540 ohms per square using Arsenic implantation in p-type silicon with an implantation voltage of 120 KEV. As may be seen therein, a sheet resistance of 240 ohms per square provides a highly positive temperature coefficient throughout the temperature range of −40 C to +85 C. With a sheet resistance of 325 ohms per square, the temperature coefficient is zero at approximately −10 C, though at +85 C, the normalized resistance has curved upward approximately 3.5%. At the other end of the sheet resistance range illustrated, a sheet resistance of 540 ohms per square provides a normalized resistance of about 2% above the minimum at 85 C, but curves upward from the minimum by nearly 5% at −40 C. However a sheet resistance of 380 ohms per square provides a minimum resistance at approximately 25 C, which resistance increases by less than 3% at the temperature extremes, and closer to approximately 2% at the temperature extremes (−40 C to 85 C).

For the implantation voltage used, and the subsequent processing, including the subsequent source/drain anneal, the implant dosage for a sheet resistivity of 380 ohms per square was approximately 1.5e14 ions/cm$^2$. However it should be noted that a different implant voltage, and perhaps to a lesser extent a different subsequent source-drain anneal would likely result in a different dosage and sheet resistivity for the smallest resistivity variation over the stated temperature range. Also best results for a different temperature range would also involve different parameters.

Referring again to FIG. 2 and the description thereof, it will be noted that the lattice scattering mobility ($U_L \sim T^{-3/2}$) is only a function of temperature and thus cannot be changed. Consequently the line in FIG. 2 with the negative slope cannot be moved. However, the impurity scattering mobility may be changed by changing the dosage of the implant. That change does not change the slope (3/2) of the curve on the log(u) versus temperature plot, but rather shifts the respective line on the plot left or right for decreased and increased dosages, respectively. Also it will be noted that because the magnitude of the slopes (3/2) of the two lines is the same, the combined mobility curve is symmetrical about temperature $T_0$, the temperature at which the maximum mobility occurs. Consequently, one can minimize the resistance change with temperature of a bulk implanted resistor over a given temperature range $T_1$ to $T_2$ by adjusting the implantation parameters (primarily dosage) to make $T_0$ ($T_1+T_2$)/2. For the common industrial temperature range of −40 C to +85 C, To would preferably be 22.5 C, or 72.5 F, or approximately room temperature. Accordingly a value of $T_0$ of about 25 C is a good choice.

Obviously, it is impossible to exactly control the parameters and thus the temperature To at which the maximum mobility occurs. However, for minimum change in resistance over the full temperature range, it is preferable in many applications to be within ±20 C, more preferably within ±10 C, and most preferably within ±5 C of the temperature $T_0$ as determined by the equation $T_0$ ($T_1+T_2$)/2, where $T_1$ to $T_2$ are the temperature extremes of the desired operating temperature range of the circuit. In that regard, because of the increasing temperature coefficient (magnitude of the slope) in the normalized resistance (FIG. 3) as the temperature moves further from the temperature To, it may be desirable to try to more accurately control the implantation to set To closer to ($T_1+T_2$)/2 for larger operating temperature ranges to keep the resistance of the resistor from becoming excessive at the high or low temperature of the range. In that regard, another way of defining the invention is to keep the resistance values at the two temperature extremes within 1% of each other, and more preferably within 0.5% of each other, or even within 0.25% for excellent minimization of resistance change over the temperature range.

In applications wherein the operating temperature is well controlled, the temperature To should be set close to the expected operating temperature, such as preferably within 20 C, more preferably within 10 C, and most preferably within 5 C of the expected operating temperature, though the resistance curve with temperature is fairly flat in the vicinity to $T_0$.

Figure 4:
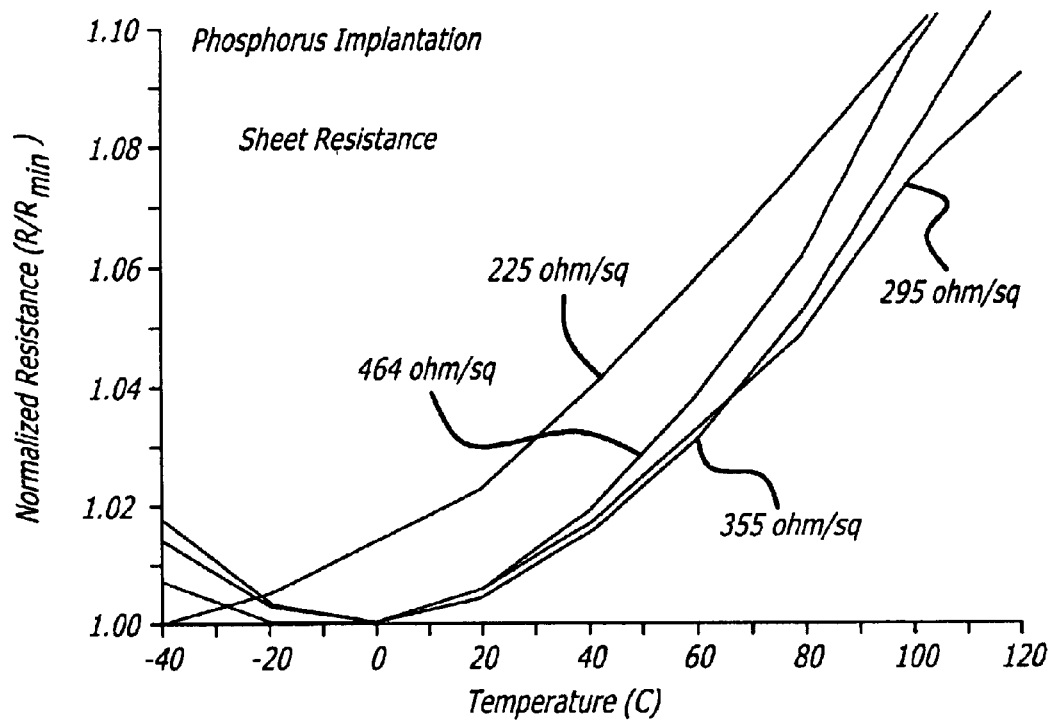
FIG. 4 is a graph of the normalized resistance ($R/R_{min}$) versus tempera or phosphorus implanted resistors.

FIG. 4 shows corresponding results for phosphorus implanted resistors. The implant dose is varied to obtain the different sheet resistances while the high temperature annealing steps are the same for each case. It is apparent that the arsenic implantation yields resistors with minimized TCR at room temperature. The phosphorus implantation yields higher TCR at room temperature and larger variation over the temperature range. For the arsenic at around 380 ohm/sq., the total resistance variation from −40 C to +85 C is less than 2%. The phosphorus implanted resistors can do no better than a total variation of about 5.5% across the same temperature range. Accordingly, arsenic implanted resistors in accordance with the present invention are preferred because of the superior results readily attainable with the arsenic implanted resistors.

Again, it should be noted that no special high temperature steps are required with the present invention, but rather one may use only what is available in a conventional CMOS process. In fact, for the data presented herein, the only thermal cycle following implantation in the crystalline silicon was the final source/drain activation anneal of a conventional CMOS process. Accordingly, the arsenic implantation should occur at least before the final high temperature step, such as the final source/drain activation anneal of a conventional CMOS integrated circuit process, or when used in a bipolar integrated circuit process, before the final high temperature step of that process. Normally, such high temperature exposure of the integrated circuit will be part of the processing for the active devices (transistors) in the integrated circuit.

While the invention has been described and illustrated in detail with respect to exemplary embodiments, it is to be understood that this disclosure is intended by way of illustration and example only, and is not to be taken by way of limitation. Thus, various changes in form and detail may be made therein without departing from the spirit and scope of the invention.

What is claimed is:

1. A method of forming a resistor on a crystalline silicon substrate in an integrated circuit intended to operate over a temperature range of $T_1$ to T2 comprising:

before a final high temperature exposure associated with the processing of the active devices of the integrated circuit, forming a resistor of one conductivity type in the crystalline silicon substrate of an opposite conductivity type by ion implantation, the resistor being isolated from the rest of the substrate by a PN junction, using an implantation dose providing, in the completed integrated circuit, a minimum resistance at a temperature of approximately $(T_1+T_2)/2$.

2. The method of claim 1 wherein the silicon substrate is a p-type substrate and the resistor body is formed by arsenic implantation.

3. The method of claim 2 wherein the temperature $T_1$ is −40 C and $T_2$ is +85 C.

4. The method of claim 2 further comprising forming first and second heavily doped regions of the same conductivity type as the resistor body to provide first and second contacts to the resistor.

5. The method of claim 4 further comprising forming an insulating layer, over the resistor with contact openings therein to provide access to the first and second heavily doped regions, and providing a patterned metal layer there over to provide electrical contact to the heavily doped regions.

6. The method of claim 1 wherein the integrated circuit is a CMOS integrated circuit.

7. The method of claim 1 wherein the integrated circuit comprises a bipolar integrated circuit.

8. The method of claim 1 wherein the minimum resistance is within 20 C of the temperature of $(T_1+T_2)/2$.

9. The method of claim 1 wherein the minimum resistance is within 10 C of the temperature of $(T_1+T_2)/2$.

10. The method of claim 1 wherein the minimum resistance is within 5 C of the temperature of $(T_1+T_2)/2$.

11. The method of claim 1 wherein the resistance values of the resistor at the two temperature extremes are within 1% of each other.

12. The method of claim 1 wherein the resistance values of the resistor at the two temperature extremes are within 0.5% of each other.

13. The method of claim 1 wherein the resistance values of the resistor at the two temperature extremes are within 0.25% of each other.

* * * * *